United States Patent [19]

Unnam et al.

[11] Patent Number: 4,681,818
[45] Date of Patent: Jul. 21, 1987

[54] OXYGEN DIFFUSION BARRIER COATING

[75] Inventors: Jalaiah Unnam, Tabb; Ronald K. Clark, Hampton, both of Va.

[73] Assignee: The United States of America as represented by the Administrator of the National Aeronautics and Space Administration, Washington, D.C.

[21] Appl. No.: 840,900

[22] Filed: Mar. 18, 1986

[51] Int. Cl.⁴ .................. B32B 15/04; B32B 15/00; B32B 15/01
[52] U.S. Cl. .................. 428/607; 428/632; 428/651; 428/660; 148/6.3; 204/192.15; 204/192.23
[58] Field of Search .............. 148/6.3; 428/660, 632, 428/610, 607, 941, 469, 450, 697, 701, 420, 651; 204/192.23, 192.15

[56] References Cited

U.S. PATENT DOCUMENTS

| | | | |
|---|---|---|---|
| Re. 31,339 | 8/1983 | Dardi et al. | 428/678 |
| 3,045,333 | 7/1962 | Finlay | 29/194 |
| 3,175,920 | 3/1965 | Michael . | |
| 3,197,291 | 7/1965 | Michael . | |
| 3,522,080 | 7/1970 | Dietzel . | |
| 3,551,247 | 12/1970 | Feakes | 156/278 |
| 3,574,678 | 4/1971 | Stark . | |
| 3,704,166 | 11/1972 | Cuomo et al. . | |
| 3,837,884 | 9/1974 | Rheinberger | 117/33.3 |
| 4,175,611 | 11/1979 | Fletcher | 428/469 |
| 4,180,596 | 12/1979 | Crowder et al. | 427/42 |
| 4,350,719 | 9/1982 | Baldi | 427/253 |
| 4,374,183 | 2/1983 | Deadmore et al. | 428/469 |
| 4,430,190 | 2/1984 | Eilers et al. . | |
| 4,442,169 | 4/1984 | Graham | 148/6.3 |
| 4,465,577 | 8/1984 | Tanielian | 428/469 |
| 4,478,648 | 10/1984 | Zeilinger et al. | 148/6.3 |
| 4,486,487 | 12/1984 | Skarp | 428/469 |
| 4,496,450 | 1/1985 | Hitotsuyanagi et al. | 204/192 R |

Primary Examiner—Sam Silverberg
Assistant Examiner—Terry J. Owens
Attorney, Agent, or Firm—George F. Helfrich; John R. Manning; Robert D. Marchant

[57] ABSTRACT

A method is disclosed for coating a titanium panel or foil with aluminum and amorphous silicon to provide an oxygen barrier abrogating oxidation of the substrate metal. The process is accomplished with inexpensive procedures common in materials research laboratories, i.e., electron beam deposition and sputtering. The procedures are conducive to treating foil gage titanium and result in submicron layers which virtually add no weight to the titanium. The ultra-thin coatings diffusion bond with the substrate titanium without costly heating steps and the coatings blend with the substrate titanium until separate mechanical properties are subsumed by those of the substrate without cracking or spallation. This method appreciably increases the ability of titanium to mechanically perform in high thermal environments such as those witnessed on structures of space vehicles during re-entry.

8 Claims, 3 Drawing Figures

OXYGEN DIFFUSION BARRIER COATING

ORIGIN OF THE INVENTION

The invention described herein was made jointly in the performance of work under NASA Contract NAS1-17683 with Analytical Services and Materials, Incorporated and an employee of the United States Government. In accordance with 35 USC 202, the contractor elected not to retain title.

BACKGROUND OF THE INVENTION

Titanium and titanium alloys are of prime interest for aerospace applications because of their favorable strength to density and high temperature characteristics compared to other aerospace materials. Titanium has been shown to be subject to embrittlement by oxidation and oxygen contamination during high temperature exposure. Because of the loss in ductility of titanium alloys exposed to oxygen containing environments at high temperatures, their use has been restricted to applications where the sustained environmental temperature is below 580° K. or where the short term temperature spiking is limited to peak temperatures below 800° K. These limitations on high temperature applications of titanium prevent the realization of the maximum mechanical and structural efficiency of the material.

The above limitations are particularly restrictive in high temperature aerospace application such as our nation's Space Shuttle program and in research and development of advanced space transport concepts. The design of an effective thermal protective system has been particularly troublesome for the Space Shuttle program. The current thermal protection system (TPS) in use on the Shuttle program, under the direction of the National Aeronautics and Space Administration, utilizes ceramic tiles to shield high temperature structural panels of the orbiter on re-entry. These tiles are fragile and subject to cracking, as well as exhibiting problems in adhesion.

Since every 0.4536 kg (pound) saved in the thermal protection system (TPS) is a 0.4536 kg (pound) of available additional payload to orbit, it is essential to have a TPS that has a low mass and is capable of enduring the service conditions for 100 missions. Research has experimented with various methods of increasing the efficiency of TPS. One approach is to increase the thermal operating temperatures of an existing material through use of some coating scheme. Titanium has been the material most often thought to have the highest potential, due to its inherent resistance to thermal stress and high strength to weight ratio.

The prior art is replete with coating methods that attempt to shield the substrate titanium from the effects of oxidation and embrittlement which result from high temperature exposure in oxygen environments. These prior art coating methods range from epitaxy chemical vapor disposition systems (CVD) to special processes where flaked aluminum is baked on the substrate metal. A limitation to these prior art systems for coating titanium is that they fail to elevate the operating temperature enough to permit use as a thermal protection system on a reusable space orbitor, or produce coatings that are bulky and take on physical or mechanical properties separate from the substrate metal. The ability to apply a submicron coating to foil gage titanium is required for development of improved multiwall panels to replace the ceramic tiles currently in use on space orbitors, without increasing weight. It is also important that the coating materials are thin enough to diffusion bond with the substrate metal without the coating itself having separate mechanical and physical properties which result in mechanical spallation or chipping and cracking when the finished product is flexed physically and/or thermally.

Current art efforts to resolve these problems have generally failed to overcome these restrictive limitations on the use of titanium in elevated thermal environments. An example of current art efforts include special processes employing expensive heat treatment steps, where various chemicals are applied to titanium including flaked aluminum, then the materials are baked in a kiln to heat diffusion bond the coating to the substrate metal. While this process does impart protection from oxygen diffusion through to the substrate metal, the coatings exhibit negative features that preclude the materials use in space applications. For instance, prior art techniques result in a coating at least 25 microns in thickness while the present invention results in coatings about 1 micron thick. This additional mass results in a coating that has its own mechanical properties leading to cracking and/or spallation, while the oxygen barrier coatings of the present invention are sufficiently thin to react with the substrate titanium to a degree that their separate mechanical properties are subsumed by those of the substrate. The extra thicknesses of the state of the art processes translate to additional mass and abrogates to a degree the advantages of titanium high strength to weight ratio, which led to titanium selection as a substrate material in TPS applications.

The present invention reveals a process for coatings that result in thermal protection virtually without adding weight to the base metal. The test results herein described show a total weight increase as small as 3.75 micrograms per square centimeter which has no impact on the weight of the structures employing the protection. Most prior art adds two to five milligrams of mass per square centimeter of protection, thus reducing the attractiveness of these coatings for in orbital thermal protection systems. It was the need to find a process that can immunize foil gage titanium for use in space thermal protection systems without adding appreciable mass or introducing the additional mechanical limitations that led to the present invention. These benefits are engendered with proven inexpensive techniques, namely, electron-beam vapor deposition and sputtering.

Accordingly, it is an object of the present invention to provide a means of protecting titanium from oxygen in high temperature environments up to 1300 degrees Fahrenheit.

Another object of the present invention is to provide a coating procedure comprising electron-beam deposition followed by sputtering.

A further object of the present invention is to provide a coating for titanium which interacts with the base alloy to form a protective layer of aluminides and silicides.

Yet another object of the present invention is to provide a means of coating titanium to form a layer functioning as a diffusion barrier coating.

Another object of the present invention is to provide a means of protecting titanium from oxygen in high temperature environments that is inexpensive to apply and employs techniques proven efficacious in the art field.

Another object of the present invention is to provide a coating for titanium that blocks oxygen diffusion to the alloy thereby eliminating the source of alloy embrittlement.

Another object of the present invention is provide a coating for titanium that does not appreciably add mass to the base material.

Yet another object of the present invention is to provide a coating for titanium that allows the alloy to function in high temperature environments such as Space Shuttle re-entry without the alloy losing tensile elongation.

A further object of the present invention is to provide a coating for titanium that is submicron in depth.

Another object of the present invention is to provide a coating for titanium that can be applied to foil gage titanium including those less than 0.001 inch in thickness.

Yet another object of the present invention is to provide a coating process that results in a coating virtually free of cracking and spallations.

STATEMENT OF THE INVENTION

According to the present invention, the foregoing and additional objects are attained by coating a titanium substrate first with a submicron layer of aluminum, electrobeam-evaporative deposited on the surface of the titanium and then with a submicron layer of silicon dioxide sputtered onto the aluminum layer to form a top coat. On exposure to high temperatures, the titanium alloy interacts with the aluminum and silicon dioxide layer to form aluminide and silicide compounds which are impervious to oxygen even on exposure to temperatures as high as 1300° F. This blocking of oxygen diffusion to the substrate alloy restricts oxygen contamination of the alloy thereby eliminating the source of embrittlement of the alloy without appreciably adding mass to the substrate material.

BRIEF DESCRIPTION OF THE DRAWINGS

A more complete appreciation of the invention and many of the attendant advantages thereof will become more readily apparent as the same becomes better understood by reference to the following detailed description when considered in connection with the accompanying drawings wherein.

DETAILED DESCRIPTION OF THE INVENTION

Figure 1:
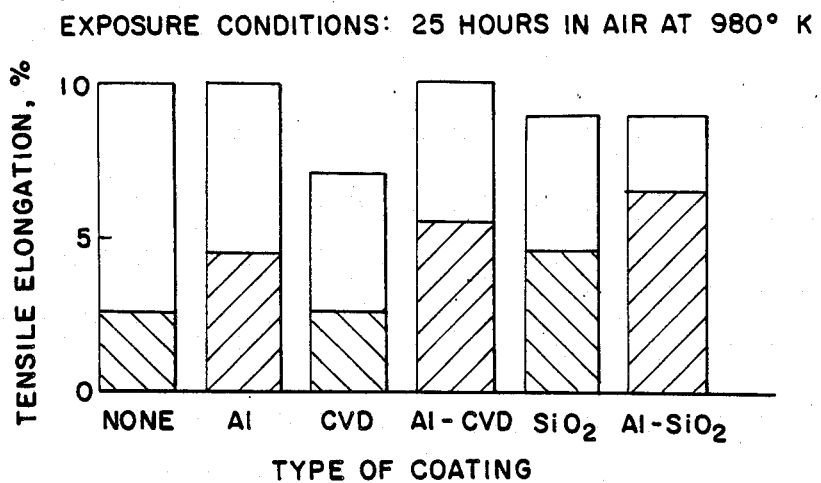
FIG. 1 illustrates in a bar graph the effect of oxygen barrier coatings on tensile elongation of Ti-6242 foil.

In a specific example tensile specimens were fabricated from 0.075 mm-thick Ti-6242 alloy in a mill annealed condition. Table I gives the chemical analysis of the material. The data were determined by wet-chemical analysis of the material.

TABLE I

Chemical Analysis of 0.075 mm
Ti—6Al—2Sn—4Zr—2Mo Alloy

| Element | Weight % |
|---------|----------|
| Al | 5.80 |
| Zr | 4.00 |
| Sn | 1.87 |
| Mo | 2.06 |
| Fe | 0.20 |
| O | 0.115 |
| Si | 0.06 |
| C | 0.02 |
| N | 0.012 |
| H | 0.049 |
| Other Elements* | <0.10 |
| Other Elements Total | <0.40 |
| Ti | Balance |

*The largest quantity of any single other element.

Specimens were cleaned and heat treated using procedures and conditions analogous to those used in fabricating titanium heat shield panels contemplated for use on aerospace vehicles in medium thermal structure zones. Table II gives the cleaning procedure for all specimens. The heat treat cycle, which includes one and one-half hours at 1200° K., is similar to the cycle utilized in the diffusion bonding process for fabricating titanium multiwall thermal protection system panels and employs procedures known in the art. Table II lists the steps employed in preparing the titanium specimens for application of the coatings.

TABLE II

Cleaning Procedure for Titanium Specimens

Vapor degrease
Hot NaOH bath —345° K., 15 minutes
Water rinse - deionized water
Pickle - 50% $HNO_3$, 3% HF, 2 minutes
Ethyl alcohol rinse
Forced air dry The heat treated specimens were prepared with micrometer thick sputtered coatings of $SiO_2$ and chemical vapor deposited (CVD) silicate coatings with and without a one-micrometer thick aluminum basecoat. The CVD silicate coating is a coating developed by Lockheed Missile and Space Company and generally considered to represent the state-of-the-art in thermal protection coatings for titanium. The CVD specimens were tested as a control in representing the state-of-the-art. The aluminum basecoat was applied using an electron beam evaporation technique in a vacuum of $6 \times 10^{-6}$ torr. The sputtered coating of $SiO_2$ was applied by sputtering a $SiO_2$ target in an argon environment. The CVD coating was applied directly to the specimen by reacting silane and borane in a hydrogen environment.

Oxidation weight gain tests were performed on specimens with each type coating using a thermogravimetric analysis unit (TGA). The TGA unit consists of a vertical tube furnace, an electrobalance for continuous monitoring of specimen weight, and a microcomputer for data collection. All TGA tests were conducted at 980° K. for twenty-five hours in laboratory air which had a nominal relative humidity of fifty percent.

Tensile specimens were exposed to static oxidation at atmospheric pressure in a laboratory air furnace at 895° K. The exposure time of 25 hours for the static oxidation tests was calculated so that the total weight gained by an uncoated specimen would equal the total weight gained by a specimen exposed to Space Shuttle re-entry for two hundred missions.

Tensile tests of specimens were conducted according to recommended practices of the American Standard Testing Methods Board. Strain of the specimen during loading was determined from two 2.5 cm gage-length extensometers mounted on opposite faces of the specimen. Yield strength was determined by the 0.2 percent offset method. The elastic modulus was determined from a least squares fit of a first order equation to the stress-strain data over the stress range from 70–400 $MN/m^2$. Tensile elongation was determined from the change in spacing of fiducial marks lightly scribed on the specimen before testing. Pencil marks were placed at 0.65 cm intervals along the gage length of the specimen. At failure, elongation was measured for a 2.5 cm section about the fracture.

Table III gives weight-gain data for coated and uncoated Ti-6242 alloy after 25 hours of oxidation at 980° K. The increase in weight is caused by pickup of oxygen by the alloy in the form of surface scale ($TiO_2$) and solid solution contamination of the metal. The total weight-gain data, which was obtained by TGA tests, showed a dramatic reduction in amount of oxygen pickup with application of oxygen barrier coatings. The TGA data were analyzed using results from previous titanium oxidation studies to determine the weight gain by solid solution contamination of the substrate alloy. The technique of using weight gain to measure oxidation is considered by those in the art field to be the most accurate. These data show that the Al-$SiO_2$ oxygen barrier coating provides the best protection of the alloy against oxidation—the oxygen contamination of Al-$SiO_2$ coated alloy was less than three percent of the level for uncoated alloy. In interpreting Table III, it is important to note that the lower the number the lower the weight gain and the lower the oxidation.

TABLE III

Weight Gain for Ti—6Al—2Sn—4Zr—2Mo Exposed at 980° K. for 25 Hours

| Type Coating | Coating Designation | Total Weight Gain, $\mu g/cm^2$ | Solid Solution Pickup, $\mu g/cm^2$ | Remarks |
|---|---|---|---|---|
| None | — | 300 | 113 | |
| Al | Al | 186 | 36 | Electron Beam (EB) Deposited |
| Silicate | CVD | 120 | 45 | Chemical Vapor Deposited (CVD) |
| Al + Silicate | Al—CVD | 33 | 6 | EB + CVD |
| $SiO_2$ | $SiO_2$ | 43 | 16 | Sputter Deposited |
| Al—$SiO_2$ | Al + $SiO_2$ | 17 | 3 | EB + Sputter Deposited |

The specimens prepared according to the present invention revealed the best mechanical properties of all the specimens tested. The ultimate tensile strength, tensile yield strength, and Young's modulus of the specimens were not affected by oxidation exposure or application of the oxygen barrier coatings. In FIG. 1 the cross-hatching represents oxidation from exposure to 980° K. for twenty-five hours and the plane areas represent the non-oxidized condition of the various coatings. The tensile elongation data, see FIG. 1, shows a marked effect of coating type on ductility of the alloy. The tensile elongation of specimens prepared with the CVD coating was significantly lower for the unoxidized condition (7%) than the tensile elongation of uncoated specimens (9.5%). The tensile elongation of unoxidized specimens prepared with other coatings was about equal to the tensile elongation of uncoated specimens. The cause for the lower ductility of the CVD coated specimens was not determined, however, it may have resulted from hydrogen embrittlement which occurred during the coating process conducted in a hydrogen atmosphere at a temperature of about 560° K. The presence of the aluminum layer of the Al-CVD coating was sufficient to prevent embrittlement of those specimens.

The tensile elongation of uncoated specimens and CVD coated specimens after oxidation exposure for twenty-five hours in air at 895° K. was 2.5%. The tensile elongation of specimens prepared with the remaining coatings and then oxidized was substantially higher than 2.5%. The highest post-oxidation tensile elongation was 6.3% which was obtained for the specimens with the Al-$SiO_2$ coating.

Figure 2:
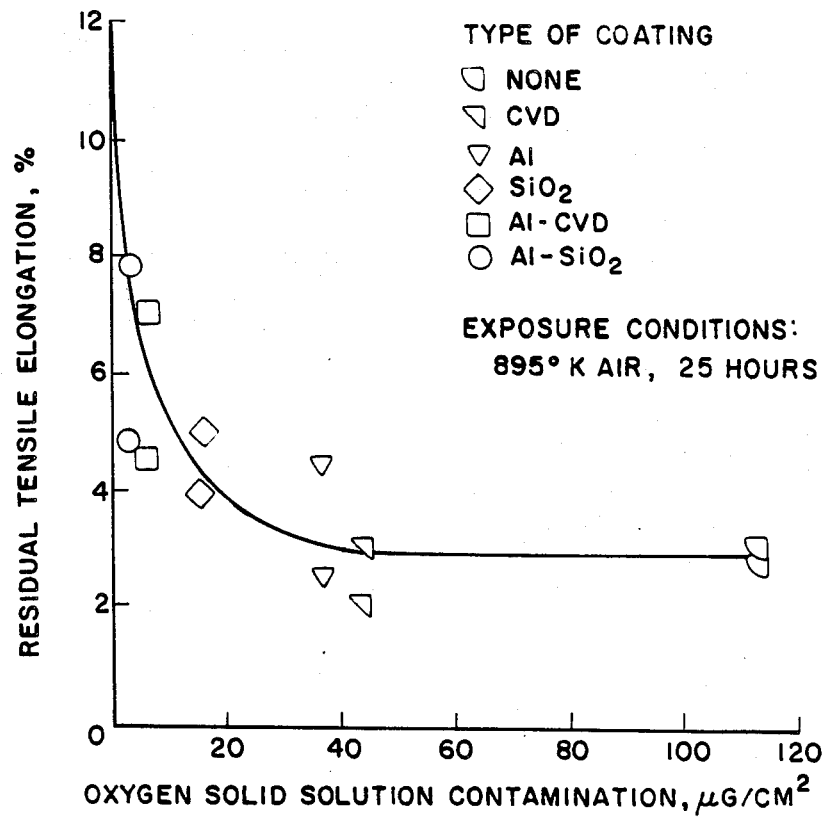
FIG. 2 is a graph showing the correlation of residual tensile elongation of control foil specimens with weight gain due to oxygen solid solution contamination of substrate alloy.

Turning now to FIG. 2, a correlation of residual tensile elongation of specimens with weight gain due to oxygen solid solution contamination of the substrate alloy is shown and was calculated using the TGA data from Table III and equations listed above. These results vividly show the sensitivity of the ductility of titanium to oxygen contamination and reveal the efficiency of applicants' process of applying Al-$SiO_2$ coatings to avoid oxidation.

Oxygen contamination of titanium results from diffusion of oxygen into the alloy on exposure to high temperature oxidation. The oxygen exists within the alloy as interstitial atoms. Contamination levels of about 1.5% produce brittle behavior of the contaminated region. Exposure of titanium to oxidizing conditions for finite times forms a contaminated layer of lower ductility at the surface. When subjected to loads, oxidized titanium may develop cracks in the contaminated layer which can serve as stress risers and thereby promote premature failure.

Figure 3:
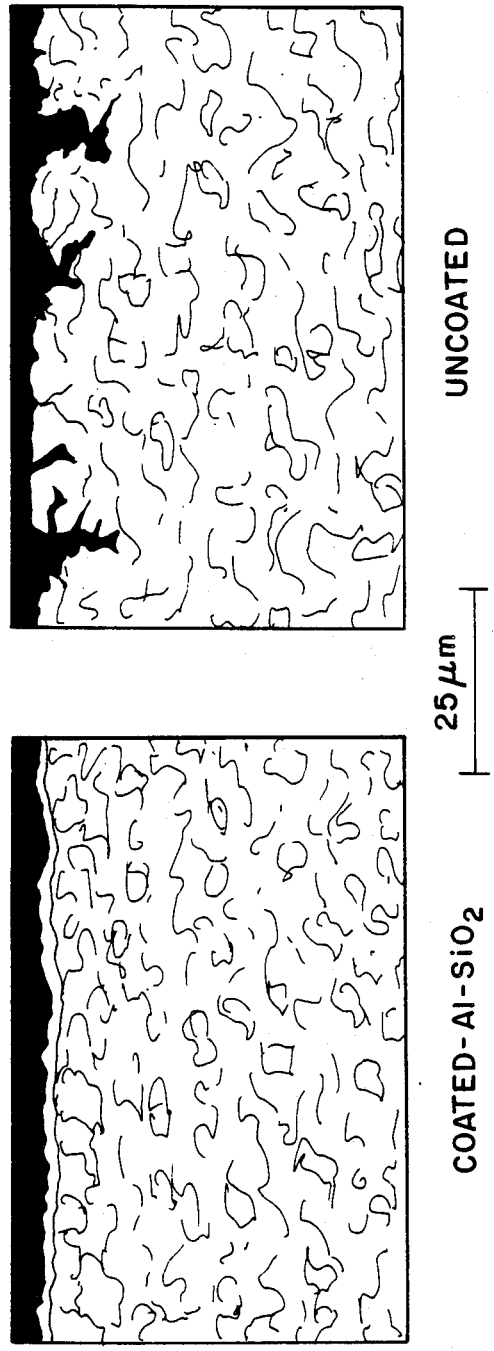
FIG. 3 is cross-section photomicrographs of coated and uncoated Ti-6242 after tensile testing.

FIG. 3 shows a cross-section photomicrograph of Al-$SiO_2$, coated and uncoated specimens, which were statically oxidized then tested to failure in tension. Cracks in the surface layer of the uncoated specimen are obvious. The specimen coated with the process taught by the present invention is totally void of surface cracks. The one-micrometer thick Al-$SiO_2$ coating, which is shown clearly in FIG. 3, performed very well as an oxygen barrier coating to prevent oxygen transport to the substrate alloy.

One ultimate use of the present invention is in the manufacture of multiwall thermal protection system panels from foil gage titanium that can elevate the operating temperature of the panels from a current limit of about 700° K. to approximately 950° K. This improvement will allow substitution of these multiwall TPS panels for the ceramic tiles on a substantial portion of the Space Shuttle resulting in lower expense, improved durability and increased payload to orbit. The structure of a multiwall thermal protection system panel enhanced by the novel coating procedure of the present invention results in the thermal operating environment of these structures increasing by several hundred degrees.

These procedures of coating titanium and other variations and modifications of the invention will be readily apparent to those skilled in the art in the light of the above teachings. Although the specific examples discussed herein are confined to titanium. the invention is not so limited. Other materials and alloys that are subject to property changes due to environmental oxygen exposure may be provided with barrier coatings according to the teachings and within the scope of the present invention. Thus, within the scope of the appended claims, the invention may be practiced other than as specifically described herein.

What is claimed as new and desired to be secured by Letters Patent of the United States is:

1. A method of providing an oxygen barrier coating onto a titanium substrate comprising the steps of:
 providing a titanium substrate surface, electron-beam-evaporative depositing a submicron aluminum layer onto the titanium substrate surface,
 depositing by sputtering a submicron silicon-dioxide layer onto the submicron aluminum layer, and
 exposing the titanium substrate to an elevated temperature during service to chemically react the titanium substrate with the submicron aluminum layer and the submicron silicon-dioxide layer to form a thermal protective barrier of aluminide and silicide on the titanium substrate surface.

2. The method of claim 1 wherein the titanium substrate is a titanium alloy.

3. The method of claim 2 wherein the titanium alloy is foil gauge Ti-6Al-2Sn-4Zr-2Mo.

4. The method of claim 1 wherein the titanium substrate is commercial purity titanium.

5. The method of claim 1 wherein the titanium substrate is of foil gage thickness.

6. The method of claim 1 wherein the depositing of the submicron silicon-dioxide layer is by sputtering the submicron aluminum layer in an argon environment.

7. The method of claim 1 wherein the exposure of the coated titanium substrate is to an elevated temperature of approximately 980° K. and for a period of approximately twenty-four hours.

8. A foil gage titanium substrate having an improved thermal protective oxygen barrier coating thereon prepared by the method of claim 1.

* * * * *